(12) United States Patent  
Matsuda et al.

(10) Patent No.: US 9,187,693 B2  
(45) Date of Patent: *Nov. 17, 2015

(54) PHOSPHORS AND METHOD FOR PRODUCING THEREOF (75) Inventors: Naotoshi Matsuda, Chigasaki (JP); Yumi Fukuda, Tokyo (JP); Keiko Albessard, Yokohama (JP); Masahiro Kato, Kanagawa-ken (JP); Iwao Mitsuishi, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 392 days.

This patent is subject to a terminal disclaimer.

(21) Appl. No.: 13/609,891

(22) Filed: Sep. 11, 2012

(65) Prior Publication Data

US 2013/0241395 A1 Sep. 19, 2013

(30) Foreign Application Priority Data

Mar. 8, 2012 (JP) ................... 2012-051731

(51) Int. Cl.
*C09K 11/77* (2006.01)
*C09K 11/08* (2006.01)
(Continued)

(52) U.S. Cl.
CPC .......... *C09K 11/7734* (2013.01); *C09K 11/0883* (2013.01); *H01L 33/502* (2013.01); *H05B 33/14* (2013.01); *H01L 2224/48091* (2013.01); *H01L 2224/48247* (2013.01)

(58) Field of Classification Search
CPC .......... C09K 11/7734; C09K 11/0883; H01L 33/502; H05B 33/14

USPC ............... 252/301.4 F, 301.4 R; 313/503
See application file for complete search history.

(56) References Cited

U.S. PATENT DOCUMENTS 8,551,360 B2   10/2013  Duan et al.
2006/0043337 A1   3/2006  Sakane et al.
(Continued)

FOREIGN PATENT DOCUMENTS

CN      101315853 A    12/2008
CN      101842461 A     9/2010
(Continued)

OTHER PUBLICATIONS

Combined Office Action and Search Report issued May 7, 2014 in Chinese Patent Application No. 201210336992.6 with English language translation.

(Continued)

*Primary Examiner* — Matthew E Hoban  
*Assistant Examiner* — Lynne Edmondson  
(74) *Attorney, Agent, or Firm* — Oblon, McClelland, Maier & Neustadt, L.L.P.

(57) ABSTRACT

The present embodiments provide a europium-activated oxynitride phosphor and a production method thereof. This phosphor emits red luminescence having a peak at 630 nm or longer and can be produced by use of inexpensive oxides as raw materials containing alkaline earth metals such as strontium. The oxynitride phosphor is activated by a divalent europium and represented by the formula (1):

$$(M_{1-x}Eu_x)Al_aSi_bO_cN_dC_e \qquad (1).$$

In the formula, M is an alkaline earth metal, and x, a, b, c, d and e are numbers satisfying the conditions of $0<x<0.2$, $1.3 \le a \le 1.8$, $3.5 \le b \le 4$, $0.1 \le c \le 0.3$, $6.7 \le d \le 7.2$ and $0.01 \le e \le 0.1$, respectively.

13 Claims, 4 Drawing Sheets (51) Int. Cl.
*H05B 33/14* (2006.01)
*H01L 33/50* (2010.01)

(56) References Cited

U.S. PATENT DOCUMENTS

| | | |
|---|---|---|
| 2008/0297031 A1 | 12/2008 | Takahashi et al. |
| 2009/0072195 A1 | 3/2009 | Fukuda et al. |
| 2010/0039020 A1 | 2/2010 | Hirosaki |
| 2010/0142181 A1* | 6/2010 | Schmidt et al. ............. 362/84 |
| 2010/0288972 A1 | 11/2010 | Roesler et al. |
| 2010/0308711 A1* | 12/2010 | Tamura et al. ............. 313/503 |
| 2012/0049115 A1 | 3/2012 | Matsuda et al. |
| 2012/0062105 A1* | 3/2012 | Li et al. ..................... 313/503 |
| 2013/0229106 A1* | 9/2013 | Mitsuishi et al. ........... 313/503 |

FOREIGN PATENT DOCUMENTS

| | | |
|---|---|---|
| EP | 2 135 919 A1 | 12/2009 |
| EP | 2 423 293 A2 | 2/2012 |
| EP | 2 423 293 A3 | 2/2012 |
| JP | 2008-163259 | 7/2008 |
| JP | 2011-80068 | 4/2011 |

OTHER PUBLICATIONS

Extended European Search Report issued Feb. 5, 2013, in European Patent Application No. 12184243.9.
Taiwanese Office Action issued Feb. 13, 2014, in Taiwan Patent Application No. 101133316 (with English translation).
Office Action issued Sep. 12, 2014, in Japanese Patent Application No. 2012-051731 with English translation.

* cited by examiner

PHOSPHORS AND METHOD FOR PRODUCING THEREOF

CROSS-REFERENCE TO RELATED APPLICATIONS

This application is based upon and claims the benefit of priority from the prior Japanese Patent Application No. 2012-051731, filed on Mar. 8, 2012, the entire contents of which are incorporated herein by reference.

FIELD

Embodiments relate to a red light-emitting phosphor suitably used in a white light-emitting LED device, and also to a method for producing that s phosphor.

BACKGROUND

A white light-emitting LED device, which is a single device comprising a phosphor and a semi-conductor light-emitting element such as LED in combination so as to give off white light, is becoming popularly used nowadays as a light source for illumination and the like. The phosphor employed in the white light-emitting LED device is required to exhibit high luminous efficiency when excited by near UV to blue light. For use as that phosphor, various oxynitride phosphors have been proposed.

For example, many europium-activated SiAlON phosphors are disclosed as the above phosphors. They are, for example, regulated by the compositions in particular ranges and/or by the positions of X-ray diffraction lines. In addition, production methods thereof and raw materials for their production are also variously disclosed.

The raw materials for producing SiAlON phosphors generally include nitrides, oxides, hydroxides and carbonates of metals, such as, strontium, europium and silicon, which constitute parts of the phosphors. However, characteristics of the resultant phosphor are often dependent on what kind of metal compound is adopted. For example, if produced according to a known method in which strontium is supplied in the form of carbonate, the resultant SiAlON phosphor contains a variant phase emitting blue luminescence. On the other hand, if the raw material of strontium is in the form of nitride such as $Sr_3N_2$, formation of the variant phase can be avoided. However, strontium nitride materials are so chemically unstable and expensive that they are difficult to use industrially.

The present inventors are now independently studying and developing a method by which europium-activated SiAlON phosphors less containing variant phases can be produced from strontium oxide or hydroxide in place of unstable and expensive $Sr_3N_2$ through intermediate products formed by plural steps. However, a red light-emitting SiAlON phosphor produced by that method is still required to give off luminescence at a longer wavelength and hence has room for improvement.

DETAILED DESCRIPTION

Embodiments will now be explained with reference to the accompanying drawings.

An embodiment provides a europium activated oxynitride phosphor which is produced by use of inexpensive oxides or hydroxides as raw materials supplying alkaline earth metals, such as strontium, and also which emits red light in the wavelength range of not shorter than 630 nm.

An embodiment resides in an oxynitride phosphor which is activated by a divalent europium and which is represented by the following formula (1):

$$(M_{1-x}Eu_x)Al_aSi_bO_cN_dC_e \qquad (1)$$

in which M is an alkaline earth metal; and x, a, b, c, d and e are numbers satisfying the conditions of $0<x<0.2$, $1.3 \leq a \leq 1.8$, $3.5 \leq b \leq 4$, $0.1 \leq c \leq 0.3$, $6.7 \leq d \leq 7.2$ and $0.01 \leq e \leq 0.1$, respectively.

Another embodiment resides in a method for producing an oxynitride phosphor, comprising the first step, in which an alkaline earth metal oxide or hydroxide, europium oxide and silicon powder or silicon nitride are mixed and fired in an atmosphere containing hydrogen and nitrogen, to form a first intermediate product;

the second step, in which the first intermediate product and carbon powder are mixed and fired in an atmosphere containing hydrogen and nitrogen, to form a second intermediate product; and the third step, in which the product obtained by the second step is mixed with, at least, silicon powder or silicon nitride and aluminum nitride, and then fired in an atmosphere containing hydrogen and nitrogen.

Still another embodiment resides in a light-emitting device comprising the above phosphor and a light-emitting element capable of exciting said phosphor.

The embodiments are described below in detail.

The phosphor according to the embodiment is a phosphor represented by the formula (1):

$$(M_{1-x}Eu_x)Al_aSi_bO_cN_dC_e \qquad (1).$$

In the formula (1), M represents an alkaline earth metal and is selected from the group consisting of Be, Mg, Ca, Sr, Ba and Ra. These alkaline earth metals can be used in combination of two or more. Preferably, Sr is contained in the formula (1) as the metal M, and the amount of Sr is preferably 80 mol % or more based on the total amount by mole of the metal M. As the alkaline earth metal other than Sr, Ca and/or Ba can be preferably used but the amount thereof is preferably 20 mol % or less based on the total amount by mole of the metal M.

In the formula (1), x, a, b, c, d and e are numbers satisfying the conditions of $0<x<0.2$, preferably $0.01 \leq x \leq 0.1$,
$1.3 \leq a \leq 1.8$, preferably $1.45 \leq a \leq 1.65$,
$3.5 \leq b \leq 4$, preferably $3.6 \leq b \leq 3.9$,
$0.1 \leq c \leq 0.3$,
$6.7 \leq d \leq 7.2$, preferably $6.8 \leq d \leq 7.1$, and
$0.01 \leq e \leq 0.1$, preferably $0.01 \leq e \leq 0.05$,
respectively.

The phosphor according to the embodiment is regarded as a kind of SiAlON phosphor, which is conventionally known, but is characterized by containing carbon and oxygen in particular amounts. That is because there have been few reports on SiAlON phosphors indispensably containing carbon and also because it has been difficult to reduce the oxygen content in known SiAlON phosphors. In view of them, the phosphor of the embodiment contains both of those characteristic components. Actually, in the above formula of the phosphor according to the embodiment, the number of e, which corresponds to the carbon content, is not equal to 0 and the oxygen content represented by the number of c is regulated in a range lower than that in known SiAlON phosphors. Owing to this characteristic composition, the phosphor of the embodiment less gives off unfavorable luminescence from the variant phase and realizes emission having a peak in the wavelength range of 630 nm or longer.

If the numbers of a, b and d, which represent contents of aluminum, silicon and nitrogen, respectively, are deviated from the above regulated ranges, the phosphor is very different from the aimed red light-emitting phosphor and contains variant phases in a large amount, so that the resultant luminous characteristics are often unfavorable. The number of x, which represents the activation concentration of europium, must necessarily be larger than 0 to obtain emission from the europium. However, if it is too large, concentration quenching may occur to decrease the luminous efficiency. Accordingly, the number of x is indispensably less than 0.2, preferably in the range of 0.01 to 0.1 inclusive so as to obtain high luminous efficiency.

The oxynitride phosphor according to the embodiment has the same crystal structure as $Sr_2Al_3Si_7ON_{13}$. Hereinafter, such oxynitride phosphor is often referred to as "$Sr_2Al_3Si_7ON_{13}$-type phosphor". This type of phosphor is based on $Sr_2Al_3Si_7ON_{13}$ phosphor, but the phosphor may be modified by replacing its constituting elements such as Sr, Si, Al, O and N with other elements and/or by fusing with other metal elements such as Eu.

The $Sr_2Al_3Si_7ON_{13}$-type phosphor has a crystal structure belonging to the orthorhombic system, and can be identified by X-ray diffraction or neutron diffraction. This means that the $Sr_2Al_3Si_7ON_{13}$-type phosphor includes not only a phosphor exhibiting the same XRD profile as $Sr_2Al_3Si_7ON_{13}$ but also a phosphor having a crystal structure in which the constituting elements are so replaced with other elements as to change the lattice constants within particular ranges. The constituting elements of $Sr_2Al_3Si_7ON_{13}$ crystal may be replaced with other elements in such a way described below in detail. Specifically, Sr in the crystal may be replaced with the emission center element Eu. Further, Al and Si may be partly substituted with each other, and at the same time O and N may be partly substituted with each other. Examples of that phosphor include $Sr_2Al_2Si_8N_{14}$, $Sr_2Al_4Si_6O_2N_{12}$, $Sr_2Al_{1.5}Si_5O_3N_{11}$ and $Sr_2Al_6Si_4O_4N_{10}$. These phosphors have crystal structures belonging to the $Sr_2Al_3Si_7ON_{13}$-type crystal.

The phosphor according to the embodiment preferably contains a component whose XRD profile measured by use of a specific X-ray of CuKα (wavelength: 1.54056 Å) shows diffraction peaks simultaneously at seven or more positions, preferably nine or more positions selected from the group consisting of the following eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of the diffraction angle (2θ).

The phosphor of the embodiment comprises carbon in its composition. In the phosphor, all or at least a part of the carbon atoms replace anionic atoms partly constituting the $Sr_2Al_3Si_7ON_{13}$-type phosphor crystal, and this means that the carbon atoms are contained not as impurities in the phosphor.

The phosphor according to the embodiment emits red luminescence when excited by light. Specifically, it gives off emission having a peak in the wavelength range of not shorter than 630 nm when exposed to light in the wavelength range of 330 to 470 nm. In contrast, conventional phosphors produced by use of oxides or hydroxides of alkaline earth metals are difficult to emit red luminescence at such a long wavelength.

There is no particular restriction on the process for producing the phosphor according to the above embodiment. However, the inventors have found a method enabling to produce efficiently the phosphor of the embodiment. Specifically, the phosphor of the embodiment can be produced in the manner described below.

In the first step, an alkaline earth metal oxide or hydroxide, such as, strontium oxide or hydroxide, europium oxide, and silicon powder or silicon nitride are mixed and fired in an atmosphere containing hydrogen and nitrogen, to form a first intermediate product. As the alkaline earth metal, those described above for the formula (1) are employable. Those alkaline earth metals can be used in combination of two or more. It is preferred to adopt Sr as the alkaline earth metal singly or in combination with other alkaline earth metals. This means that strontium oxide or hydroxide is preferably used as one of the starting materials. Although strontium oxide and strontium hydroxide are hygroscopic, they can be handled to weigh, to mix and/or to treat in air unless left for a long time. Further, since they are inexpensive, it is industrially significant to adopt them in place of expensive and unstable $Sr_3N_2$.

In the first step of the method according to an embodiment, the mixture is preferably fired in a firing container made of non-oxide material, such as, boron nitride (BN) or silicon carbide (SiC). The firing container of non-oxide material enables to reduce sufficiently the oxygen content in the first intermediate product obtained in the first step. In contrast, it should be noted that, if the mixture is fired in a firing container made of oxide material such as alumina, the obtained intermediate product has such a large oxygen content that the resultant oxynitride phosphor contains variant phases in a considerable amount. Since the variant phases act as a prevention factor of luminescence, the phosphor containing them in a considerable amount is inevitably poor in luminous efficiency.

The starting materials in the first step of the method according to the embodiment include a compound of europium, which serves as the emission center element, and a compound of silicon, which constitutes a part of the phosphor crystal. As the europium compound, $Eu_2O_3$ is used. Although other europium compounds such as $Eu_2N_3$ are usable, $Eu_2O_3$ is preferred in view of the production cost. However, if the intermediate product is required to contain oxygen only in a very small amount, a considerable amount of $Eu_2N_3$ may be used in combination. As the silicon compound, $Si_3N_4$ or Si powder is used. These silicon compounds contain oxygen only in small amounts, and hence are advantageous to keep the oxygen content at a low level in the intermediate product. Further, they are chemically stable enough to treat in air without problems or difficulties.

The first intermediate product obtained in the first step contains a component represented by $(M,Eu)_2Si_5N_8$. This component emits orange or red luminescence having an emission peak in the wavelength range of 600 nm or longer. Further, the first intermediate product may contain other oxygen-containing phases such as $(M,Eu)_2SiO_4$ and $(M,Eu)$ Si$_2$O$_2$N$_2$. However, in order to obtain the aimed phosphor containing only a small amount of variant phases, it is necessary to reduce the ratio by mole of oxygen to the sum of M and Eu and it is preferred that the ratio be less than 1.0. If the first intermediate product contains oxygen in too large an amount, it is difficult in the following steps to prevent the formation of variant phases containing considerable amounts of oxygen.

The firing temperature in the first step is preferably in the range of 1300 to 1600° C. If the temperature is below this range, the (M,Eu)$_2$Si$_5$N$_8$ phase may be formed insufficiently. On the other hand, if the temperature is higher than that range, the resultant phosphor is liable to have composition different from the aimed composition, for example.

The firing procedure in the first step is carried out in an atmosphere containing hydrogen and nitrogen, namely, in a reductive atmosphere, so as to reduce the oxygen content in the intermediate product. There is no particular restriction on the ratio between hydrogen and nitrogen in the atmosphere, but the ratio is generally in the range of 2:98 to 75:25. The atmosphere may contain other inert gases, but needs to contain oxygen in as small an amount as possible. There is no particular restriction on the firing pressure, and hence the firing procedure is carried out generally under atmospheric pressure.

In the following second step, a second intermediate product is synthesized. Specifically, the first intermediate product obtained in the first step is mixed with carbon powder, and then fired in an atmosphere containing hydrogen and nitrogen. In this step, carbon atoms of the carbon powder are thought to combine with oxygen atoms in oxygen-containing phosphors such as (Sr,Eu)$_2$SiO$_4$ and (Sr,Eu)Si$_2$O$_2$N$_2$ contained in the first intermediate product. As a result, it is presumed that oxygen in excess of the desired amount is removed and at the same time a small amount of carbon is incorporated into the crystal, so as to form the second intermediate product. The amount of the carbon powder used in the second step is preferably 1.0 to 2.0 times as much as the total amount of the alkaline earth metal and europium in terms of the ratio by mole. If it is smaller than the sum of them, oxygen is removed so insufficiently that the resultant red-light emitting phosphor cannot give off luminescence at a wavelength of 630 nm or longer. On the other hand, if the carbon powder is used in an amount larger than the above, unreacted carbon may remain to impair the emission properties.

There is no particular restriction on the carbon powder, which hence can be freely selected according to necessity from, for example, powders of graphite, carbon black, activated carbon, amorphous carbon and the like. In view of the availability and the cost, powders of graphite and activated carbon are preferred.

The firing temperature in the second step is preferably in the range of 1300 to 1600° C. Similarly to the first step, the firing procedure in the second step is carried out in an atmosphere containing hydrogen and nitrogen. The firing atmosphere in the second step can be determined within the conditions described above for that in the first step. The firing procedure in the second step does not need to be carried out under the same conditions as that in the first step.

The present inventors have studied and found that a red-light emitting phosphor produced without the second step gives off luminescence having a peak at a wavelength shorter than 630 nm. The reason of that is not clearly revealed but is thought to be because oxygen originated from the starting material of strontium remains in the phosphor to increase the oxygen content, namely, to increase the number of c in the formula (1).

Finally, in the third step, the second intermediate product is mixed with supplementary materials added for adjusting the composition to that of the aimed oxynitride phosphor, and then fired in an atmosphere containing hydrogen and nitrogen.

The supplementary materials are silicon nitride, silicon powder or a combination thereof, and an aluminum nitride. Similarly to the first step, non-oxide materials are used as the supplementary materials so as to control the oxygen content in the resultant oxynitride phosphor.

In consideration of the reactivity, the silicon powder preferably has a small mean particle size. Specifically, the mean particle size thereof is preferably less than 150 μm, further preferably less than 50 μm. On the other hand, however, if the silicon powder contains oxygen and other impurities, the resultant luminance characteristics are often impaired. From this viewpoint, the silicon powder preferably has a large mean particle size. Specifically, the mean particle size is preferably not less than 5 μm. Here, the "mean particle size" means a 50% median diameter, which can be determined by means of, for example, a laser diffraction/scattering particle size analyzer manufactured by HORIBA, Ltd.

If the raw materials contain oxygen in too small an amount, aluminum oxide (Al$_2$O$_3$) can be used as an auxiliary material so as to control the oxygen content in the resultant oxynitride phosphor. The amount of the auxiliary material is so determined that the ratio by mole among the sum of M and Eu, Al (that is, the total amount of aluminum in aluminum nitride and aluminum oxide) and Si (that is, the total amount of silicon in (M,Eu)$_2$Si$_5$N$_8$ and the after-added silicon phosphors such as silicon nitride and silicon powder) may correspond to the component ratio of the aimed phosphor. Specifically, the raw material mixture used in the second step is so prepared as to contain M, Eu, Al and Si in such amounts that the ratio by mole among M+Eu, Al and Si may correspond to 1:a:b of (M$_{1-x}$Eu$_x$)Al$_a$Si$_b$O$_c$N$_d$C$_e$. However, Si may volatilize during the firing procedure in the third step. In that case, the amount of silicon nitride or silicon powder is preferably designed to be larger than the theoretical value.

In view of the production cost, the firing procedure is preferably carried out at a low temperature. If the firing temperature is 1500° C. or more, it is possible in most cases to obtain a phosphor having satisfying characteristics. The firing temperature is, therefore, preferably 1500° C. or more.

Similarly to the first and second steps, the firing procedure in the third step is carried out also in an atmosphere containing hydrogen and nitrogen. The firing atmosphere in the third step can be determined within the conditions described above for that in the first step. The firing procedure in the third step does not need to be carried out under the same conditions as that in the first step or in the second step.

There is no particular restriction on the firing container used in this firing procedure. However, since the firing temperature is relatively high, the firing container is preferably a BN crucible.

Light-Emitting Device

A light-emitting device according to still another embodiment comprises the above phosphor and a light-emitting element capable of exciting that phosphor.

In the light-emitting device according to the embodiment, the above phosphor gives off red luminescence. However, if the device is wanted to emit light in different color, the phosphor can be combined with other phosphors so that the resultant device can emit light in desired color.

For example, in the case where the device is wanted to emit white light, the device may comprise (1) a light-emitting element serving as an excitation source; and a combination of the aforementioned red light-emitting phosphor (R) and a yellow light-emitting phosphor (Y) or a green light-emitting phosphor (G) each of which emits luminescence under excitation by light given off from the light-emitting element; or otherwise (2) a light-emitting element serving as an excitation source; and a combination of the above red light-emitting phosphor (R), a yellow light-emitting phosphor (Y) or a green light-emitting phosphor (G), and a blue light-emitting phosphor (B) each of which emits luminescence under excitation by light given off from the light-emitting element.

The light-emitting element such as LED used in the device is properly selected according to the phosphors used together. Specifically, it is necessary that light given off from the light-emitting element be capable of exciting the phosphors. Further, if the device is preferred to radiate white light, the light-emitting element preferably gives off light of such a wavelength that it can complement luminescence emitted from the phosphors.

In view of the above, if the device comprises the red and yellow or green phosphors, the light-emitting element (S1) is generally so selected that it gives off light in the wavelength range of 330 to 470 nm. If the device comprises the red, yellow or green, and blue phosphors, the light-emitting element (S2) is generally so selected that it gives off light of 250 to 430 nm.

Figure 1:
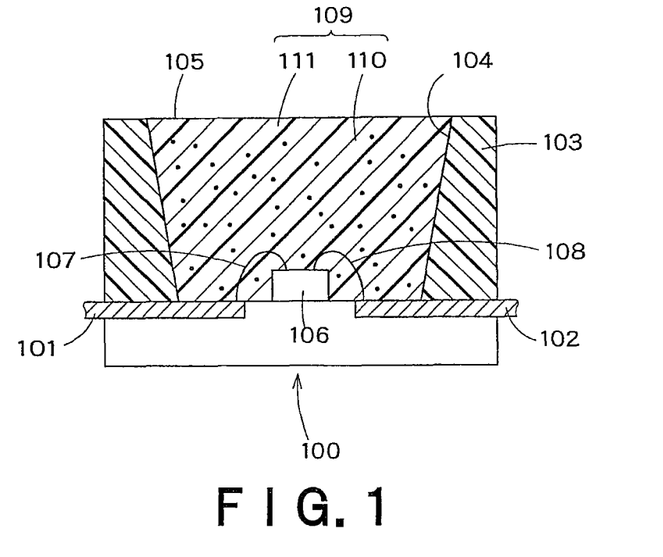
FIG. 1 shows a vertical sectional view schematically illustrating a light-emitting device according to an embodiment.

The light-emitting device according to the embodiment can be in the form of any conventionally known light-emitting device. FIG. 1 is a vertical sectional view schematically illustrating a light-emitting device of the embodiment.

In the light-emitting device shown in FIG. 1, a resin system 100 comprises leads 101 and 102 molded as parts of a lead frame and also a resin member 103 formed by unified molding together with the lead frame. The resin member 103 gives a concavity 105 in which the top opening is larger than the bottom. On the inside wall of the concavity, a reflective surface 104 is provided.

At the center of the nearly circular bottom of the concavity 105, a light-emitting element 106 is mounted with Ag paste or the like. Examples of the light-emitting element 106 include a light-emitting diode and a laser diode. The light-emitting element is selected so that it can emit light in a proper wavelength according to the phosphors used together in combination. For example, a semiconductor light-emitting element such as GaN can be used as the light-emitting element. The electrodes (not shown) of the light-emitting element 106 are connected to the leads 101 and 102 by way of bonding wires 107 and 108 made of Au or the like, respectively. The positions of the leads 101 and 102 can be adequately modified.

In the concavity 105 of the resin member 103, a phosphor layer 109 is provided. For forming the phosphor layer 109, a mixture 110 containing the phosphor of the embodiment can be dispersed or precipitated in a resin layer 111 made of silicone resin or the like in an amount of 5 to 50 wt %. The phosphor of the embodiment comprises an oxynitride matrix having high covalency, and hence is generally so hydrophobic that it has good compatibility with the resin. Accordingly, scattering at the interface between the resin and the phosphor is prevented enough to improve the light-extraction efficiency.

The light-emitting element 106 may be of a flip chip type in which n-type and p-type electrodes are placed on the same plane. This element can avoid troubles concerning the wires, such as disconnection or dislocation of the wires and light-absorption by the wires. In that case, therefore, a semiconductor light-emitting device excellent both in reliability and in luminance can be obtained. Further, it is also possible to employ an n-type substrate in the light-emitting element 106 so as to produce a light-emitting device constituted as described below. In that device, an n-type electrode is formed on the back surface of the n-type substrate while a p-type electrode is formed on the top surface of the semiconductor layer on the substrate. One of the n-type and p-type electrodes is mounted on one of the leads, and the other electrode is connected to the other lead by way of a wire. The size of the light-emitting element 106 and the dimension and shape of the concavity 105 can be properly changed.

The light-emitting device according to the embodiment is not restricted to the package cup-type shown in FIG. 1, and can be freely applied to any type of devices. For example, even if the phosphor according to the embodiment is used in a shell-type or surface-mount type light-emitting device, the same effect can be obtained.

COMPARATIVE EXAMPLE 1

Figure 2:
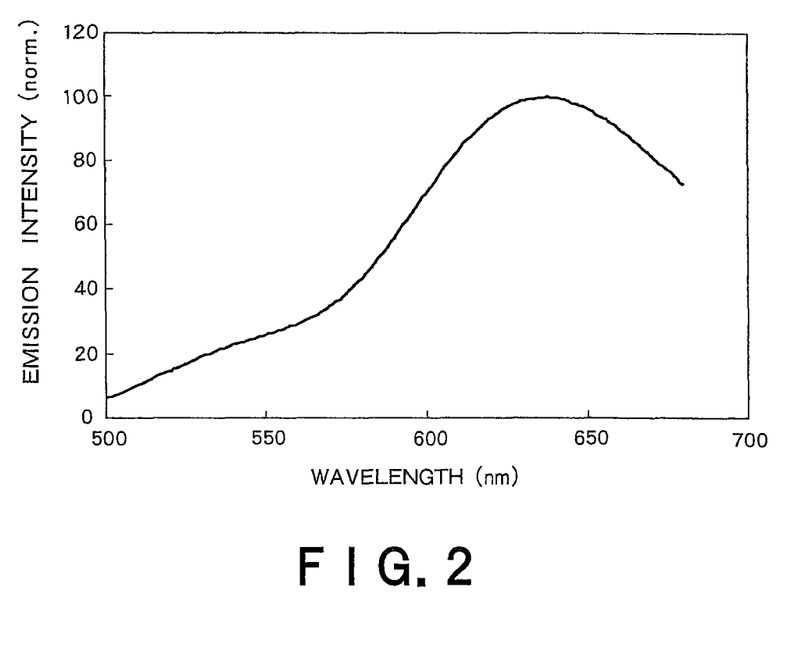
FIG. 2 shows an emission spectrum of the first intermediate product obtained by the first step.

As the starting materials, $Sr(OH)_2$, $Eu_2O_3$ and $Si_3N_4$ in the amounts of 13.9 g, 1.06 g and 13.5 g, respectively, were weighed out so that the ratio by mole of Sr:Eu:Si might be 0.95:0.05:2.4, and then dry-mixed. The mixture was placed in a BN container and fired at 1400° C. for 4 hours under atmospheric pressure in a reductive atmosphere in which flow rates of $H_2$ and $N_2$ were 5 L/min. and 5 L/min., respectively, to synthesize a first intermediate product X1 in the first step. The obtained intermediate product X1 was subjected to X-ray diffraction measurement by use of Cu—Kα line, and thereby verified to show the diffraction patterns of $Sr_2Si_5N_8$ and $SrSi_2O_2N_2$. Further, it exhibited the emission spectrum of FIG. 2 when exposed to UV light at 365 nm.

Figure 4:
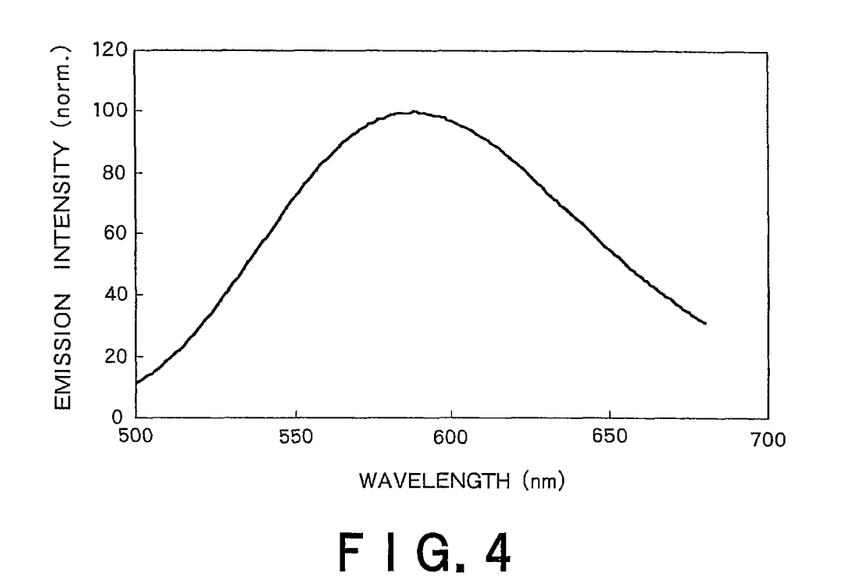
FIG. 4 shows an emission spectrum of the phosphor produced in Comparative example 1.

Subsequently, the first intermediate product X1, $Si_3N_4$ and AlN in the amounts of 6.4 g, 1.68 g and 1.84 g, respectively, were weighed out so that the ratio by mole of Sr:Eu:Al:Si might be 0.95:0.05:1.5:3.6, and then dry-mixed. The mixture was placed in a BN container and fired at 1600° C. for 4 hours under atmospheric pressure in a reductive atmosphere in which flow rates of $H_2$ and $N_2$ were 5 L/min. and 5 L/min., respectively, to synthesize a phosphor of Comparative example 1, which was produced without the second step. The obtained phosphor gave an X-ray diffraction pattern similar to that of the red light-emitting phosphor disclosed in JP-A 2011-80068 (KOKAI), but exhibited the emission spectrum of FIG. 4, in which the emission peak was positioned at as short a wavelength as 588 nm, when excited by UV light at 365 nm. Further, the obtained phosphor was subjected to composition analysis, and found to have a large oxygen content. Actually, the ratio by mole of Sr:Eu:Al:Si:O:N:C was found to be 0.95:0.05:1.62:3.8:1.26:6.78:0.003.

EXAMPLE 1

Figure 3:
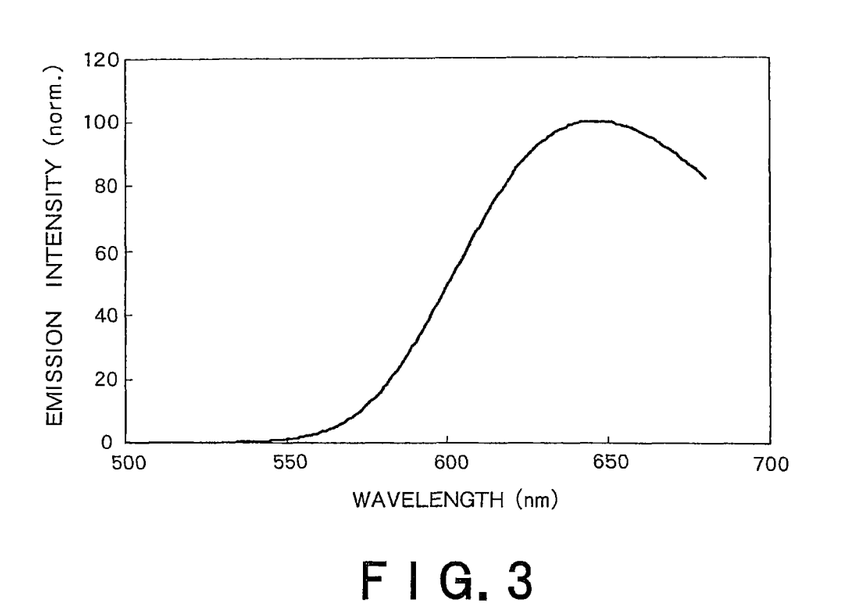
FIG. 3 shows an emission spectrum of the second intermediate product obtained by the second step.

The first intermediate product X1 and carbon powder in the amounts of 11.5 g and 0.90 g, respectively, were weighed out and dry-mixed. In the mixture, the amount of the carbon powder was 1.5 times as much as the sum of Sr and Eu contained in the intermediate product X1 in terms of the amount by mole. The mixture was placed in a BN container and then fired at 1600° C. for 4 hours under atmospheric pressure in a reductive atmosphere in which flow rates of $H_2$ and $N_2$ were 5 L/min. and 5 L/min., respectively, to obtain a second intermediate product Y1 in the second step. The obtained second intermediate product Y1 was subjected to X-ray diffraction measurement by use of Cu—Kα line, and thereby verified to show almost only the diffraction pattern of $Sr_2Si_5N_8$ phase. Further, it exhibited the emission spectrum of FIG. 3 when exposed to UV light at 365 nm.

Figure 5:
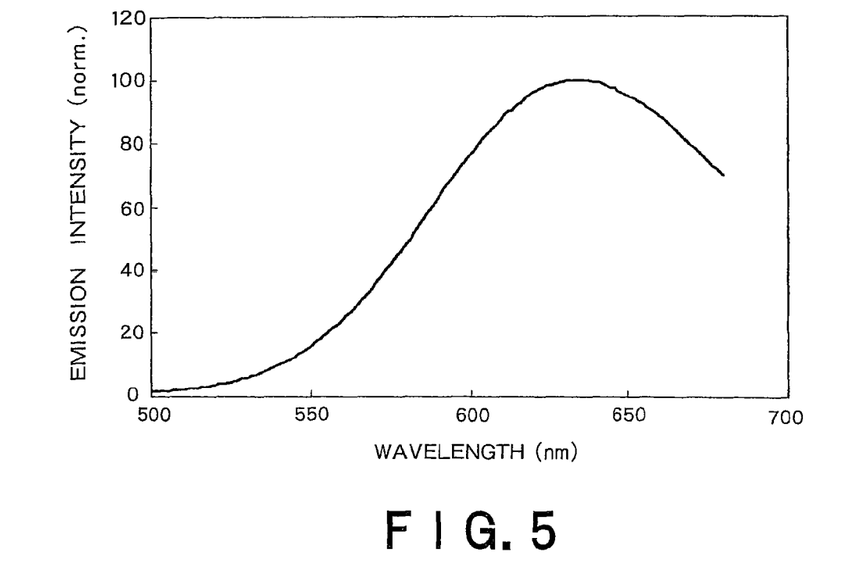
FIG. 5 shows an emission spectrum of the phosphor produced in Example 1.

Subsequently, the second intermediate product Y1, $Si_3N_4$ and AlN in the amounts of 6.4 g, 1.68 g and 1.84 g, respectively, were weighed out so that the ratio by mole of Sr:Eu:Al:Si might be 0.95:0.05:1.5:3.6, and then dry-mixed. The mixture was placed in a BN container and fired at 1600° C. for 4 hours under atmospheric pressure in a reductive atmosphere in which flow rates of $H_2$ and $N_2$ were 5 L/min. and 5 L/min., respectively, to synthesize a phosphor of Example 1. The obtained phosphor gave an X-ray diffraction pattern similar to that of the red light-emitting phosphor disclosed in JP-A 2011-80068 (KOKAI), and exhibited the emission spectrum of FIG. 5, in which the emission peak was positioned at as long a wavelength as 637 nm, under excitation by UV light at 365 nm. In addition, the emission intensity was 1.3 times as high as that of the phosphor produced in Comparison example 1. Further, the obtained phosphor was subjected to composition analysis, and consequently the ratio by mole of Sr:Eu:Al:Si:O:N:C was found to be 0.95:0.05:1.55:3.8:0.26:6.95:0.025.

Figure 6:
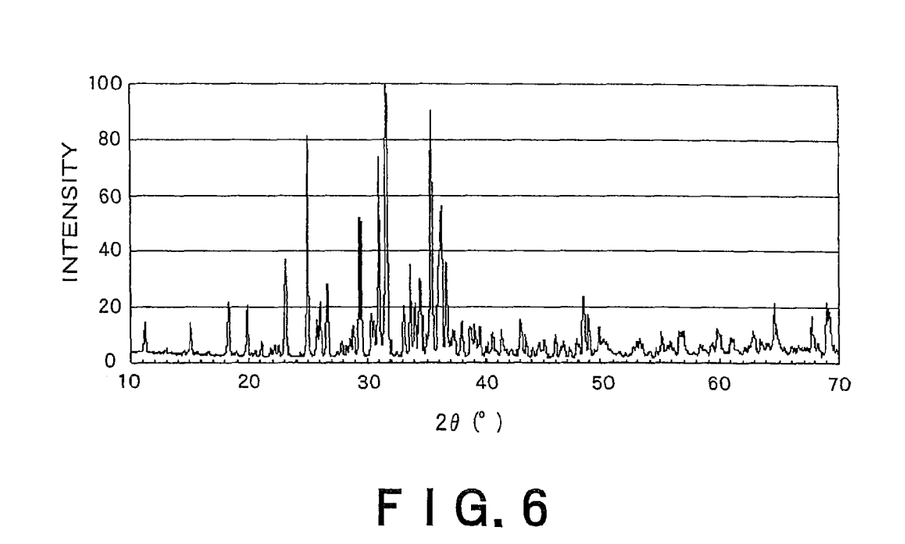
FIG. 6 is an XRD profile of the phosphor produced in Example 1.

With respect to the obtained phosphor, an XRD profile was measured by use of a specific X-ray of CuKα (wavelength: 1.54056 Å). The XRD profile was measured by means of M18XHF[22]-SRA type X-ray diffractometer ([trademark], manufactured by MAC Science Co. Ltd.). The measurement conditions were: tube voltage: 40 kV, tube current: 100 mA, and scanning speed: 2°/minute. The result was shown in FIG. 6. The XRD profile exhibited diffraction peaks at all the following eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of the diffraction angle (2θ).

EXAMPLE 2

The phosphor produced in Example 1 was placed in a BN container and then subjected to supplementary firing at 1800° C. for 4 hours in a pressurized nitrogen atmosphere at 7.5 atm, to synthesize a phosphor of Example 2. The obtained phosphor emitted luminescence having a peak at 632 nm under excitation by UV light at 365 nm. The emission intensity was 1.3 times as high as that of the phosphor produced in Comparison example 1. Further, the obtained phosphor was subjected to composition analysis, and consequently the ratio by mole of was found to be 0.95:0.05:1.5:3.85:0.22:7.02:0.013.

COMPARATIVE EXAMPLE 2

The second intermediate product Y1, $Si_3N_4$, AlN and $Al_2O_3$ in the amounts of 6.4 g, 1.68 g, 1.64 g and 0.25 g, respectively, were weighed out so that the ratio by mole of Sr:Eu:Al:Si might be 0.95:0.05:1.5:3.6, and then dry-mixed. The mixture was placed in a BN container and fired at 1600° C. for 4 hours under atmospheric pressure in a reductive atmosphere in which flow rates of $H_2$ and $N_2$ were 5 L/min. and 5 L/min., respectively, to synthesize a phosphor of Comparative example 2. The obtained phosphor gave an X-ray diffraction pattern similar to that of the red light-emitting phosphor disclosed in JP-A 2011-80068 (KOKAI), but emitted luminescence having a peak at as short a wavelength as 612 nm when excited by UV light at 365 nm. The emission intensity was 1.2 times as high as that of the phosphor produced in Comparison example 1. Further, the obtained phosphor was subjected to composition analysis, and consequently the ratio by mole of Sr:Eu:Al:Si:O:N:C was found to be 0.95:0.05:1.55:3.8:0.53:6.6:0.02.

COMPARATIVE EXAMPLE 3

The first intermediate product X1 and carbon powder in the amounts of 11.5 g and 0.30 g, respectively, were weighed out and dry-mixed. In the mixture, the amount of the carbon powder was 0.5 times as much as the sum of Sr and Eu contained in the intermediate product X1 in terms of the amount by mole. The mixture was placed in a BN container and then fired at 1600° C. for 4 hours under atmospheric pressure in a reductive atmosphere in which flow rates of $H_2$ and $N_2$ were 5 L/min. and 5 L/min., respectively, to obtain a second intermediate product Y2 in the second step. The obtained second intermediate product Y2 was subjected to X-ray diffraction measurement by use of Cu—Kα line, and thereby verified to show the diffraction pattern of $SrSi_2O_2N_2$ phase as well as that of $Sr_2Si_5N_8$ phase. The second intermediate product Y2, $Si_3N_4$ and AlN in the amounts of 6.7 g, 1.68 g and 1.84 g, respectively, were weighed so that the ratio by mole of Sr:Eu:Al:Si might be 0.95:0.05:1.5:3.6, and then dry-mixed. The mixture was placed in a BN container and then fired at 1600° C. for 4 hours under atmospheric pressure in a reductive atmosphere in which flow rates of $H_2$ and $N_2$ were 5 L/min. and 5 L/min., respectively, to synthesize a phosphor of Comparative example 3. The obtained phosphor gave an X-ray diffraction pattern similar to that of the red light-emitting phosphor disclosed in JP-A 2011-80068 (KOKAI), but emitted luminescence having a peak at as short a wavelength as 612 nm when excited by UV light at 365 nm. The emission intensity was 0.7 times as high as that of the phosphor produced in Comparison example 1. Further, the obtained phosphor was subjected to composition analysis, and consequently the ratio by mole of Sr:Eu:Al:Si:O:N:C was found to be 0.95:0.05:1.44:3.5:1.03:6.01:0.044.

Figure 7:
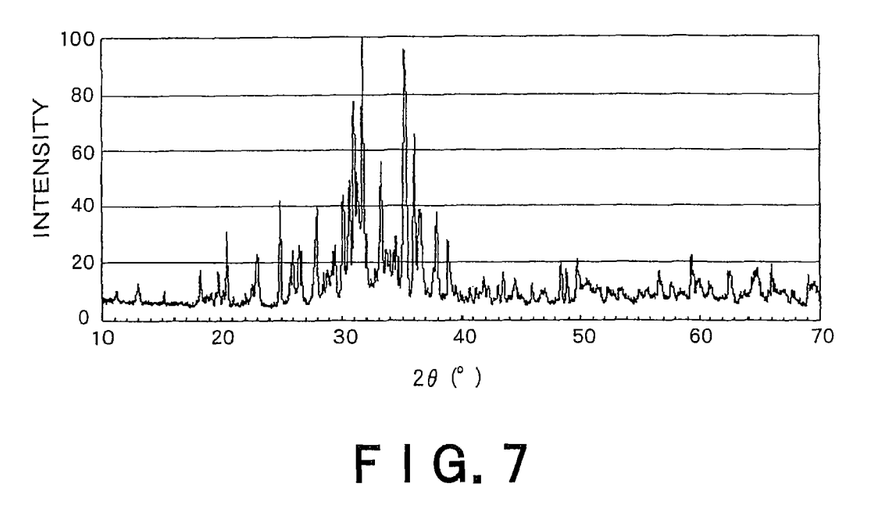
FIG. 7 is an XRD profile of the phosphor produced in Comparative example 3.

With respect to the obtained phosphor, an XRD profile was measured in the same manner as in Example 1. The result was shown in FIG. 7. The XRD profile exhibited diffraction peaks at six positions among the following eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of the diffraction angle (2θ). There were no peaks at the positions other than the above six positions, and some peaks were found out of those positions.

EXAMPLE 3

As the starting materials, $Sr(OH)_2$, $Eu_2O_3$ and Si powder in the amounts of 13.9 g, 2.11 g and 8.09 g, respectively, were weighed out so that the ratio by mole of Sr:Eu:Si might be 0.9:0.1:2.4, and then dry-mixed. The mixture was placed in a BN container and fired at 1400° C. for 4 hours under atmospheric pressure in a reductive atmosphere in which flow rates of $H_2$ and $N_2$ were 5 L/min. and 5 L/min., respectively, to synthesize a first intermediate product X2 in the first step. The first intermediate product X2 and carbon powder in the amounts of 11.0 g and 0.60 g, respectively, were weighed out and dry-mixed. In the mixture, the amount of the carbon powder was equal to the sum of Sr and Eu contained in the intermediate product X2 in terms of the amount by mole. The mixture was placed in a BN container and then fired at 1600° C. for 4 hours under atmospheric pressure in a reductive atmosphere in which flow rates of $H_2$ and $N_2$ were 5 L/min. and 5 L/min., respectively, to obtain a second intermediate product Y3 in the second step. The second intermediate product Y3, Si$_3$N$_4$ and AlN in the amounts of 6.5 g, 1.68 g, and 1.84 g, respectively, were weighed out so that the ratio by mole of Sr:Eu:Al:Si might be 0.9:0.1:1.5:3.6, and then dry-mixed. The mixture was placed in a BN container and fired at 1600° C. for 4 hours under atmospheric pressure in a reductive atmosphere in which flow rates of H$_2$ and N$_2$ were 5 L/min. and 5 L/min., respectively, to synthesize a phosphor of Example 3. The obtained phosphor gave an X-ray diffraction pattern similar to that of the red light-emitting phosphor disclosed in JP-A 2011-80068 (KOKAI), and emitted luminescence having a peak at 651 nm when excited by UV light at 365 nm. The emission intensity was 1.05 times as high as that of the phosphor produced in Comparison example 1. Further, the obtained phosphor was subjected to composition analysis, and consequently the ratio by mole of Sr:Eu:Al:Si:O:N:C was found to be 0.9:0.1:1.55:3.7:0.26:6.85:0.09.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An oxynitride phosphor which is activated by a divalent europium and which is represented by the following formula (1):

$$(M_{1-x}Eu_x)Al_aSi_bO_cN_dC_e \qquad (1)$$

in which M is an alkaline earth metal; and x, a, b, c, d and e are numbers satisfying the conditions of $0 \leq x \leq 0.2$, $1.3 \leq a \leq 1.8$, $3.5 \leq b \leq 4$, $0.1 \leq c \leq 0.3$, $6.7 \leq d \leq 7.2$ and $0.01 \leq e \leq 0.1$, respectively, and which contains a component whose XRD profile measured by use of a specific X-ray of CuKα shows diffraction peaks simultaneously at seven or more positions selected from the group consisting of the following eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of the diffraction angle (2θ).

2. The oxynitride phosphor according to claim 1, wherein strontium is contained as the alkaline earth metal M.

3. The oxynitride phosphor according to claim 1, which emits luminescence having a peak at a wavelength of not shorter than 630 nm and not greater than 651 nm under excitation by light in the wavelength range of 330 to 470 nm.

4. A method for producing an oxynitride phosphor, comprising:

a first step, in which an alkaline earth metal oxide or hydroxide, europium oxide and silicon powder or silicon nitride are mixed and fired in an atmosphere containing hydrogen and nitrogen, to form a first intermediate product;

a second step, in which the first intermediate product and carbon powder are mixed and fired in an atmosphere containing hydrogen and nitrogen, to form a second intermediate product; and a third step, in which the second intermediate product is mixed with, at least, silicon powder or silicon nitride and aluminum nitride, and then fired in an atmosphere containing hydrogen and nitrogen to produce an oxynitride phosphor which is activated by a divalent europium and which is represented by the following formula (1):

$$(M_{1-x}Eu_x)Al_aSi_bO_cN_dC_e \qquad (1)$$

in which M is an alkaline earth metal; and x, a, b, c, d and e are numbers satisfying the conditions of $0 \leq x \leq 0.2$, $1.3 \leq a \leq 1.8$, $3.5 \leq b \leq 4$, $0.1 \leq c \leq 0.3$, $6.7 \leq d \leq 7.2$ and $0.01 \leq e \leq 0.1$, respectively, and which contains a component whose XRD profile measured by use of a specific X-ray of CuKα shows diffraction peaks simultaneously at seven or more positions selected from the group consisting of the following eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of the diffraction angle (2θ).

5. The method according to claim 4, wherein the alkaline earth metal includes strontium.

6. The method according to claim 4, wherein the first intermediate product contains oxygen in a ratio by mole of less than 1.0 based on the sum of alkaline earth metal and europium contained therein.

7. The method according to claim 4, wherein firing temperature in the first step is in the range of 1300 to 1600° C.

8. The method according to claim 4, wherein the amount of the carbon powder to mix in the second step is 1.0 to 2.0 times as much as the sum of the alkaline earth metal and europium in terms of the ratio by mole.

9. The method according to claim 4, wherein firing temperature in the second step is in the range of 1300 to 1600° C.

10. The method according to claim 4, wherein the silicon powder has a mean particle size ranging from not less than 5 μM to less than 150 μm.

11. The method according to claim 4, wherein firing temperature in the third step is 1500° C. or more.

12. The method according to claim 4, wherein the oxynitride phosphor obtained by the third step is further fired in a pressurized nitrogen atmosphere.

13. A light-emitting device comprising the oxynitride phosphor according to claim 1 and a light-emitting element capable of exciting said phosphor.

* * * * *